United States Patent [19]
Ludikhuize

[11] Patent Number: 5,473,180
[45] Date of Patent: Dec. 5, 1995

[54] SEMICONDUCTOR DEVICE WITH AN MOST PROVIDED WITH AN EXTENDED DRAIN REGION FOR HIGH VOLTAGES

[75] Inventor: Adrianus W. Ludikhuize, Eindhoven, Netherlands

[73] Assignee: U.S. Philips Corporation, New York, N.Y.

[21] Appl. No.: 273,527

[22] Filed: Jul. 11, 1994

[30] Foreign Application Priority Data

Jul. 12, 1993 [BE] Belgium .............................. 09300718

[51] Int. Cl.$^6$ ................................................... H01L 29/78
[52] U.S. Cl. ......................... 257/336; 257/339; 257/344; 257/345; 257/367; 257/404; 257/408; 257/653
[58] Field of Search ...................................... 257/336, 339, 257/408, 404, 653, 344, 345, 367

[56] References Cited

U.S. PATENT DOCUMENTS 5,216,275  6/1993  Chen ........................ 257/493

FOREIGN PATENT DOCUMENTS 0069429  1/1983  European Pat. Off. .
4107867  8/1990  Japan .

Primary Examiner—Edward Wojciechowicz
Attorney, Agent, or Firm—Steven R. Biren

[57] ABSTRACT

A semiconductor device with a semiconductor body (1) includes a surface region (3) of a first conductivity type which adjoins a surface and in which a field effect transistor is provided which includes a channel region (7) with a gate electrode (8) above it, and a source region (4), a drain region (5) and a drain extension region (6). The drain extension region (6) serves to improve the drain breakdown voltage of the field effect transistor. In practice, a high breakdown voltage is accompanied by a comparatively high on-resistance of the transistor. According to the invention, the drain extension region (6) has a geometry different from that in known transistors, i.e. the drain extension region (6) includes a number of zones (25) of the second conductivity type which extend from the channel region (7) to the drain region (5) and which have a width (26) and doping concentration such that, when the voltage difference across the blocked pn junction (28) between the surface region (3) and the drain extension region (6) is increased, the drain extension region (6) is fully depleted at least locally before drain breakdown occurs. This renders it possible to choose the number and the width (26) of the zones (25) as an additional parameter of the device. Such devices have comparatively high drain breakdown voltages and comparatively low on-resistances which cannot be realized with a continuous drain extension region (6).

5 Claims, 3 Drawing Sheets

SEMICONDUCTOR DEVICE WITH AN MOST PROVIDED WITH AN EXTENDED DRAIN REGION FOR HIGH VOLTAGES

BACKGROUND OF THE INVENTION

The invention relates to a semiconductor device with a semiconductor body comprising a surface region of a first conductivity type which adjoins a surface and in which a field effect transistor with insulated gate is provided, with source and drain regions of the second, opposed conductivity type in the surface region and a drain extension region of the second conductivity type which adjoins the drain region and the surface, which has a lower doping concentration than the drain region, and which extends longitudinally in the direction of the source region, with a channel region of the first conductivity type situated between the drain extension region and the source region, and with a gate electrode situated above the channel region and separated from the channel region by an insulating layer.

Such a semiconductor device is particularly useful as a switching element at high voltages, for example, for applications in motorcars, TV sets and audio power amplifiers.

European Patent no. 69429 discloses a device of the kind mentioned in the opening paragraph. In this device, a drain extension region of the same conductivity type as but with a lower doping concentration than the strongly doped drain region is provided between the gate electrode and the comparatively strongly doped drain region. The surface region is electrically interconnected with the source region. Starting from a certain drain voltage, i.e. the voltage between source and drain regions, when the pn junction between the surface region and the drain extension region is blocked, the drain extension region is pinched off owing to an expansion of a depletion zone from the blocked pn junction, whereby the surface field strength at the side of the drain region is reduced and the voltage between the source and drain regions at which breakdown takes place, the so-called drain breakdown voltage, is increased.

Although high drain breakdown voltages can be achieved in this manner, a high breakdown voltage is accompanied in practice by a comparatively high source-drain resistance, i.e. the on-resistance ($R_{on}$) of the transistor is high. This is because only a comparatively weak doping of the drain extension region will lead to a sufficient depletion of the drain extension region. This weak doping, however, leads to a high resistance of the drain extension region. In practice, moreover, an additional doping step is often necessary for providing the desired weak doping in the drain extension region. Such an additional doping step makes the process flow more intricate and expensive, and is therefore undesirable.

SUMMARY OF THE INVENTION

The invention has for its object inter alia to provide a semiconductor device in which drain breakdown voltage and on-resistance can be varied within wide margins, preferably without additional process steps being necessary.

The invention is based on the recognition that this can be achieved by giving the drain extension region a different geometry. According to the invention, the device is for this purpose characterized in that the drain extension region comprises a number of zones of the second conductivity type, which zones extend from the channel region to the drain region and have a width and doping concentration such that upon an increase in the voltage difference across the blocked pn junction between the surface region and the drain extension region the drain extension region is fully depleted at least locally before drain breakdown takes place.

The measure according to the invention renders it possible to choose the number and the width of the zones as an additional parameter of the device. It is a surprise to find that devices according to the invention can have drain breakdown voltages and on-resistance values which cannot be realize with a continuous drain extension region. It is suspected that depletion of the zones in a device according to the invention takes place both from a lower side of the zones in vertical direction and from lateral sides of the zones in lateral direction. Owing to this so-called multidimensional depletion, full depletion can take place even with a comparatively high doping level of the zones, so that electric fields near the drain extension region remain comparatively weak and a comparatively high drain breakdown voltage is obtained. The on-resistance of the device is comparatively low owing to the comparatively strong doping in the zones.

The zones may be manufactured in a comparatively simple manner without additional process steps in that a drain extension region having zones is provided instead of a continuous drain extension region during the drain extension region doping step. A comparatively low doping level may be achieved through lateral and vertical diffusion of doping atoms during the provision of the zones. Such a low level increases the drain breakdown voltage and thus affords additional possibilities for nevertheless obtaining a device with a comparatively high breakdown voltage by means of a standard doping step in which a comparatively large quantity of dopant atoms is implanted. The on-resistance of the device is influenced by the diffusion only to a minor extent.

In a first embodiment, the width of the zones is approximately equal to the depth of the drain extension region, while the doping concentration decreases from the centre of each zone to an edge of the zone. Such zones may be manufactured in a simple manner, for example, by providing the dopant atoms through implantation and subsequent diffusion. Diffusion from the implanted zones then leads to a decrease in the doping concentration towards the edges of the zones. In general, the zones will lie substantially against one another. In this geometry of the drain extension region, the surface area of the semiconductor body is optimally utilized. A comparatively small interspacing between the zones already leads to multidimensional depletion and to an improvement in the drain breakdown voltage.

In a further embodiment, the width of the zones increases from the channel region to the drain region. This embodiment offers the advantage that the drain breakdown voltage increases as compared with that of zones of constant width. Owing to the increasing zone width from the channel region to the drain region, the electric field is spread more evenly, so that the maximum value of the electric field is reduced and drain breakdown takes place at higher voltages. A further advantage is that the on-resistance of the transistor becomes lower because the increasing width of the zones renders the resistance in the zones lower than in zones of constant width.

In a further embodiment, the zones are interconnected by a region of the second conductivity type in a portion of the drain extension region which adjoins the channel region. The channel region is a continuous region then, i.e. current can cross from the source to the drain extension region over the entire width of the channel and not only at the areas of the zones, which results in a steeper transistor. To realize a high drain breakdown voltage, it may be desirable to use additional means for depleting the drain extension region adjoining the channel region. This may be achieved through the application of a field plate above this portion of the drain extension region, which field plate is insulated from the drain extension region and, for example, electrically connected to the source region or the gate electrode. It is also possible to deplete this portion of the drain extension region by providing a strongly doped layer of the first conductivity type on a boundary between substrate and surface region. This strongly doped layer then extends to below the portion of the drain extension region which adjoins the channel region. The portion of the drain extension region adjoining the channel region is then additionally depleted from the strongly doped region, so that no premature breakdown will occur in this portion of the drain extension region.

In a further embodiment, the zones are interconnected by a region of the second conductivity type in a portion of the drain extension region which adjoins the drain region. The transition between drain extension region and drain region is less abrupt then, so that no peaks occur in electric fields and a higher drain breakdown voltage can be realized.

In a further embodiment, the quantity of dopant atoms in the zones is approximately $6\times10^{12}$ atoms/cm$^2$. Such a quantity renders it possible to use a doping for a so-called well in a CMOS (complementary MOS) process for doping of the zones of the drain extension region and nevertheless obtain a comparatively high drain breakdown voltage.

BRIEF DESCRIPTION OF THE DRAWING

The invention will be explained in more detail below by way of example with reference to several embodiments and the accompanying diagrammatic drawing, in which.

The Figures are purely diagrammatic and not drawn to scale. Corresponding parts are generally given the same reference numerals in the Figures. Wiring patterns on the surface have been omitted in the plan views of FIGS. 2, 5 and 6 for reasons of clarity.

DESCRIPTION OF THE PREFERRED EMBODIMENTS

Figure 1:
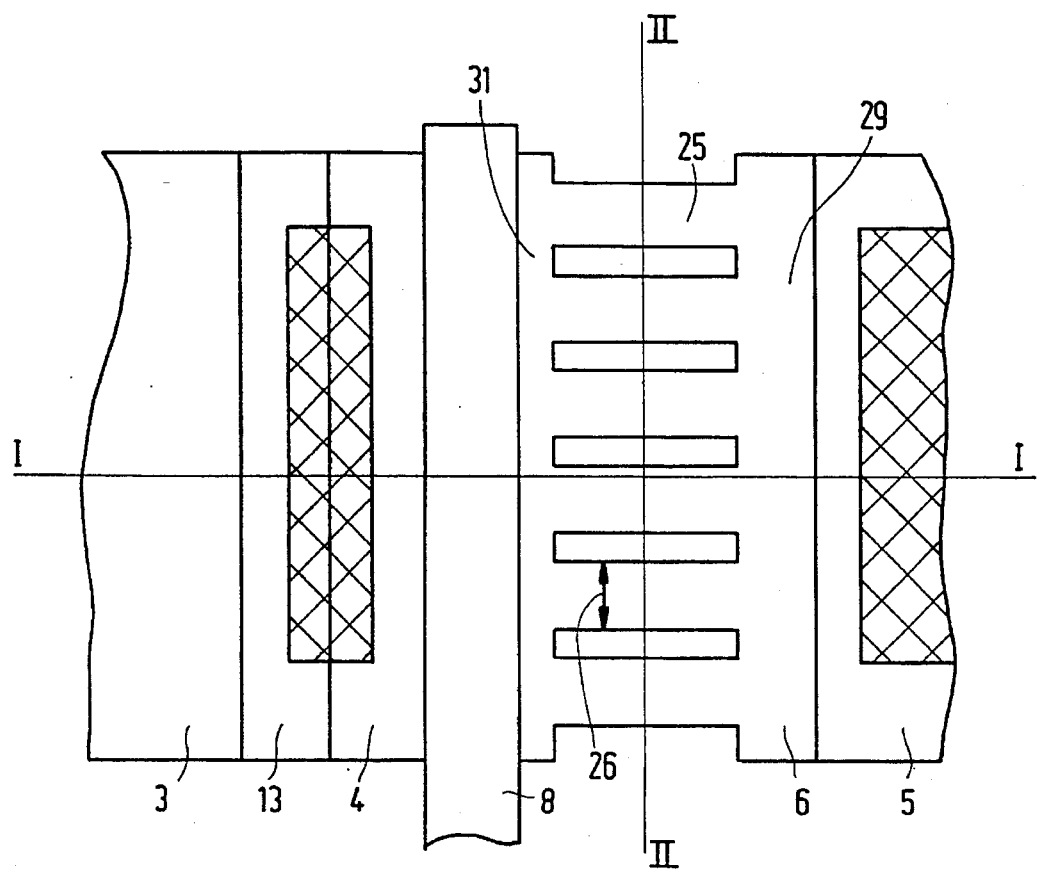
FIG. 1 is a plan view of the semiconductor device according to the invention.
Figure 2:
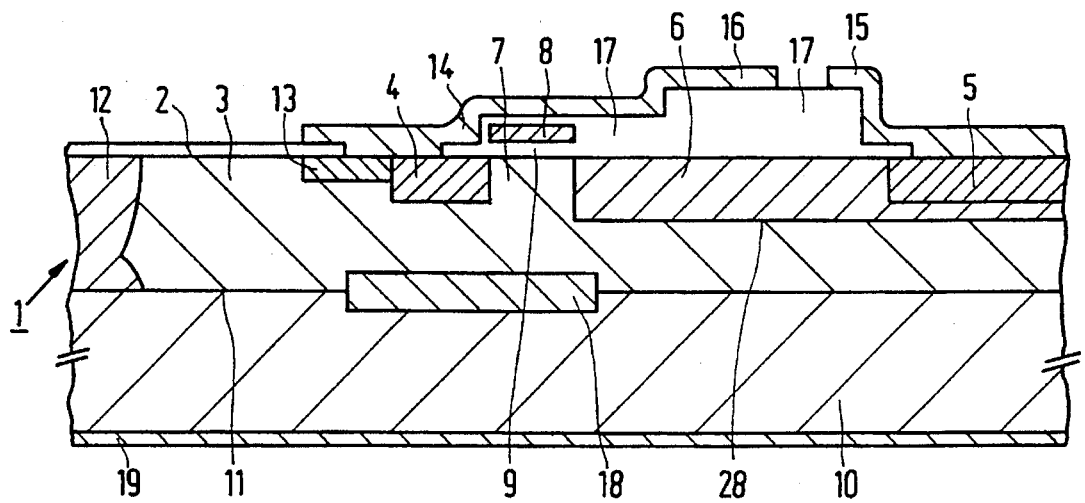
FIG. 2 is a cross-section through a semiconductor device taken on the line I—I in FIG. 1.
Figure 3:
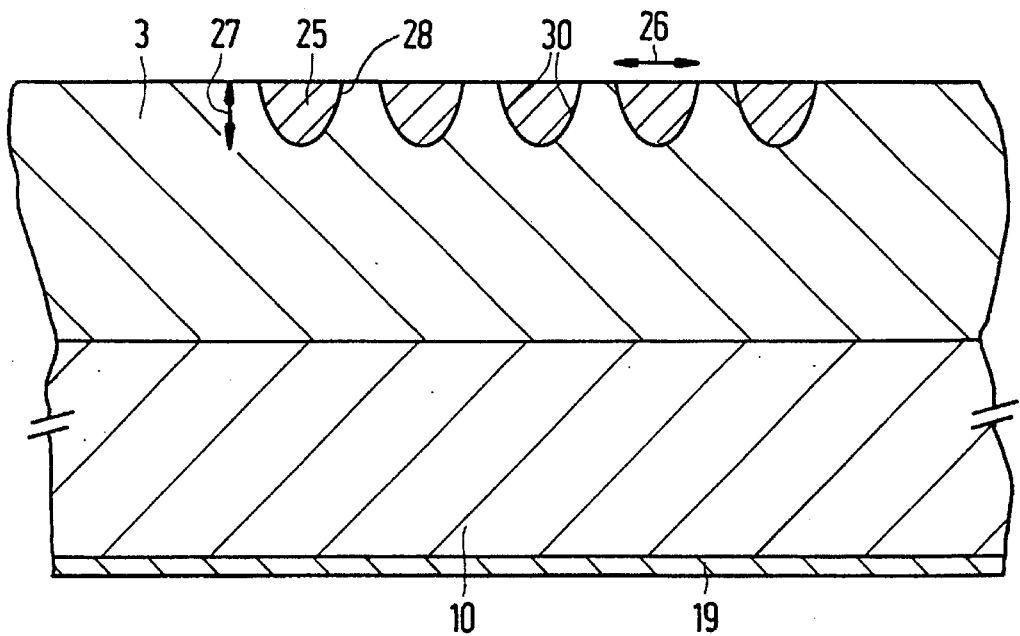
FIGS. 3 and 4 are cross-sections through different embodiments of the semiconductor device taken on the line II—II in FIG. 1.

FIG. 1 is a plan view and FIGS. 2 and 3 are two cross-sections taken on the lines I—I and II—II of FIG. 1, respectively, of a semiconductor device according to the invention. The semiconductor device comprises a semiconductor body 1, in this example made of silicon, having a surface region 3 of a first conductivity type, in this case n-type, adjoining a surface 2, in which region a field effect transistor with insulated gate is provided. The field effect transistor comprises source and drain regions 4 and 5 of the second, opposite conductivity type, so the p-type in this example, in the surface region 3. It further comprises a drain extension region 6 of the second, p-conductivity type with a lower doping concentration than the drain region 5 and adjoining the drain region 5 and the surface 2. The drain extension region 6 extends longitudinally in the direction of the source region 4. A channel region 7 of the first, n-conductivity type, which forms part of the surface region 3, is situated between the drain extension region 6 and the source region 4. A gate electrode 8 of the field effect transistor is present above the channel region and is separated from the channel region 7 by an insulating layer, in this example a silicon oxide layer 9 with a thickness of 70 nm. The gate electrode 8 in this example is made of polycrystalline silicon, but it may alternatively be made from, for example, a metal.

The surface region 3 is formed by an n-type epitaxial layer on a semiconductor body 10 formed by a p-type semiconductor substrate. The surface region 3 is laterally bounded by a p-type separation region 12 which extends from the surface 2 down to the substrate 10.

Adjoining the source region 4 there is an n$^+$-type region, the backgate contact region 13, which acts as a connection region for the surface region 3. Above the source region 4 and the backgate contact region 13, an electric conductor 14 is provided which acts as a source electrode and which also short-circuits the source region 4 with the surface region 3 via the backgate contact region 13. A drain electrode 15 is present on the drain region 5, while a connection electrode 19 for the substrate is provided on a lower side of the semiconductor body 1.

A semiconductor device as in the present example, a p-channel MOST with a drain extension region, is also called EPMOS. A p-type silicon substrate 10 with a doping concentration of $5\times10^{14}$ atoms/cm$^3$ (resistivity approximately 30 Ω.cm) is used as the semiconductor body. The surface region 3 comprises an n-type layer which is epitaxially provided on the semiconductor body and which has a doping concentration of $3\times10^{15}$ atoms/cm$^3$ and a thickness of 9 μm (resistivity approximately 1.5 Ω.cm). The backgate contact region 13 has an n-type doping concentration of $5\times10^{15}$ atoms/cm$^2$ and the source region 4 and drain region 5 have a p-type doping of $2\times10^{15}$ atoms/cm$^2$. The drain extension region 6 has a doping of $6\times10^{12}$ atoms/cm$^2$. The separation region 12 has a p-type doping of $1\times10^{15}$ atoms/cm$^2$. The width of the channel region 7 is 50 μm and its length is 8 μm. The drain extension region 6 has a length of 18 μm against a width of 50 μm.

Such a semiconductor device is particularly suitable for use as a switching element at high voltages, for example, in applications in motorcars, TV sets and audio power amplifiers. Various measures may be taken to improve the drain breakdown voltage of the field effect transistor, serving to decrease the field strength at or adjacent the surface in those locations where there is a risk of avalanche breakdown.

Thus a drain extension region 6 of the same conductivity type as but with a lower doping concentration than the strongly doped drain region 5 is provided in the semiconductor device described above between the gate electrode 8 and the comparatively strongly doped drain region 5. When a high voltage is applied to the drain electrode 15 in relation to the source and gate electrodes 14, 8, the electric field near an edge of the channel region 7 is reduced by the drain extension region 6. Owing to this reduction, drain breakdown takes place at high drain voltages only.

To increase the drain breakdown voltage, furthermore, a field plate 16 above the drain extension region 6 may be used, electrically connected to the source region 4 or the gate electrode 8. The field plate 16 is separated from the drain extension region 6 by a stepped insulating layer 17, for example made of silicon oxide. The drain breakdown voltage may be further increased by the application of a strongly doped layer 18 of the first conductivity type at a boundary between the substrate 10 and the surface region 3 below the channel region 7 and the drain extension region 6. The field plate 16 and the strongly doped layer 18 achieve an additional depletion of the drain extension region 6.

An EPMOS as described above provided with a field plate 16, a buried layer 18 with a doping of $3\times10^{15}$ atoms/cm$^2$ and with a continuous drain extension region 6 with a doping of $6\times10^{12}$ atoms/cm$^2$ has a drain breakdown voltage of 45 V and an on-resistance of 4000 Ω (for a 12-V gate voltage). If a higher drain breakdown voltage value is desired in practice, the doping of the drain extension region 6 is reduced, because only a comparatively weak doping of the drain extension region 6 will lead to a full depletion of the drain extension region 6. This weak doping leads to a high resistance of the drain extension region 6, while moreover an additional doping step is required for realizing the weak doping of the drain extension region 6.

According to the invention, the drain extension region has a geometry different from that of the known drain extension region 6 in that it comprises a number of zones 25 of the second conductivity type which extend from the channel region 7 to the drain region 5 and which have a width 26 and doping concentration such that, when the voltage difference across the blocked pn junction 28 between the surface region 3 and the drain extension region 6 is increased, the drain extension region 6 is fully depleted at least locally before drain breakdown takes place. The measure according to the invention renders it possible to choose the number and the width 26 of the zones 25 as an additional parameter of the device.

It is suspected that depletion of the zones 25 takes place in a device according to the invention both from a lower side of the zones in vertical direction, i.e. transverse to the surface 2, and from the lateral sides 30 of the zones in lateral direction, i.e. parallel to the surface 2. Owing to this so-called multidimensional depletion, full depletion can nevertheless take place at a comparatively high doping level of the zones 25, so that electric fields near the drain extension region 6 remain comparatively low and a comparatively high drain breakdown voltage is obtained. The on-resistance of the device is comparatively low owing to the comparatively strong doping in the zones 25.

FIG. 3 shows a first embodiment in which the width 26 of the zones 25 is approximately equal to the depth 27 of the drain extension region 6, while the doping concentration decreases from the centers of the zones 25 to an edge 28 of each zone 25. The zones 25 may be manufactured in a comparatively simple manner without additional process steps in that a drain extension region with zones 25 is provided instead of a continuous drain extension region 6 in the doping step for the drain extension region 6. It suffices for this to adapt an illumination mask for the definition of the drain extension region 6. In the example described here, the drain extension region may thus be subdivided into, for example, six zones 25 (see FIG. 1). The drain extension region 6 is then provided in a known manner by implantation and diffusion through a window manufactured by means of the illumination mask. The window in this example had a width of 3 µm with an interspacing of 6 µm between windows. The zones 25 are then provided by implantation through the window such that this results in approximately $6\times10^{12}$ atoms/cm$^2$ in the zones 25.

Such a concentration of dopant atoms renders it possible to use a standard doping for a p-well in a CMOS (complementary MOS) process for doping the zones 25 of the drain extension region 6. After the implantation a heat treatment at 1150° C. is given during six hours. The zones 25 have a width of approximately 6 µm and a depth of approximately 5 µm after the diffusion. A comparatively low doping level in the zone 25 after dopant atoms have diffused away laterally and vertically, and the reduction in the doping concentration takes place towards the edges 28 of the zones 25. A low doping level reduces the drain breakdown voltage and thus offers additional possibilities for nevertheless obtaining a device with a comparatively high breakdown voltage in a standard doping step, in which a comparatively large quantity of dopant atoms is implanted. The on-resistance of the device is influenced by the diffusion to a small extent only.

Figure 4:
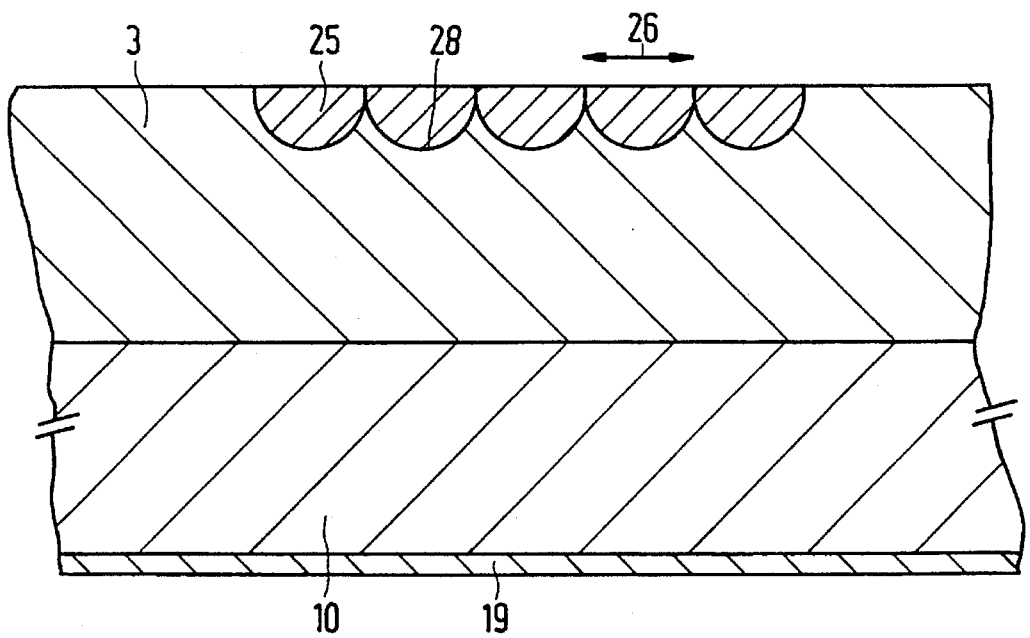

The zones 25 may lie substantially against one another, as shown in FIG. 4. In this geometry of the drain extension region 6, the surface area 2 of the semiconductor body is optimally utilized. A comparatively small interspacing between the zones 25 already leads to multidimensional depletion and an improvement in the drain breakdown voltage.

When a transistor with a continuous drain extension region 6 is compared with a transistor having a drain extension region with zones 25, given an equal concentration of dopant atoms in zones 25 and continuous regions 6, the device according to the invention has a much higher drain breakdown voltage accompanied by a comparatively small increase in the resistance. The semiconductor device according to the invention described above has a breakdown voltage of 140 V at an on-resistance of approximately 5600 Ω. The drain breakdown voltage has accordingly risen more than threefold, while the on-resistance has risen by only 40% compared with a known transistor. When a transistor having a continuous drain extension region 6 with a comparatively low concentration of dopant atoms is compared with a transistor having a drain extension region with zones 25 with a higher concentration of dopant atoms in the zones 25, the device according to the invention can have a much lower resistance at the same drain breakdown voltage.

Figure 5:
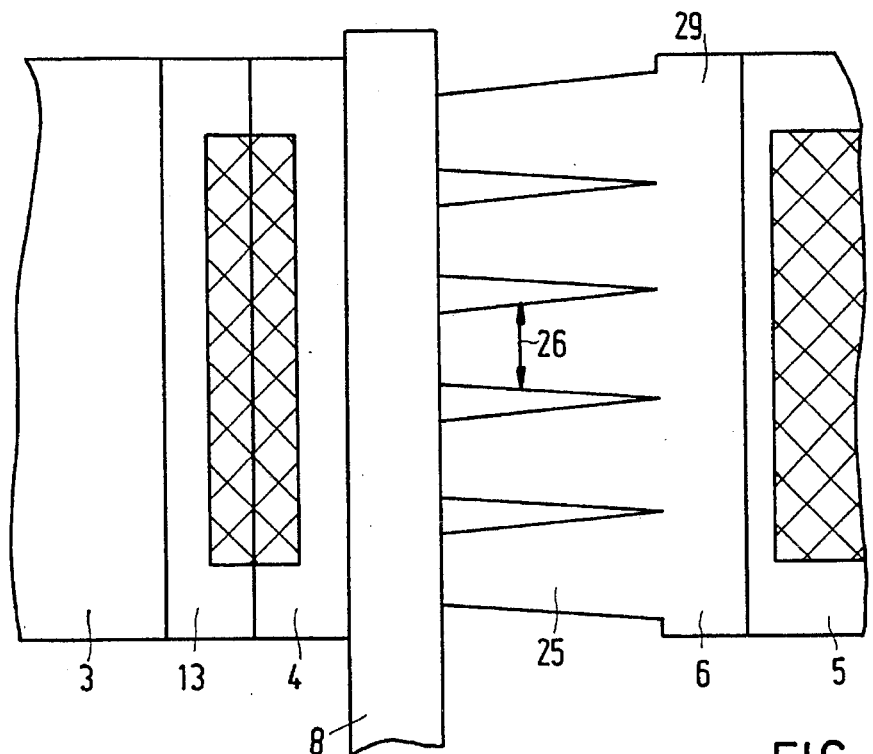
FIGS. 5 and 6 are plan views of further embodiments of a semiconductor device according to the invention.
Figure 6:
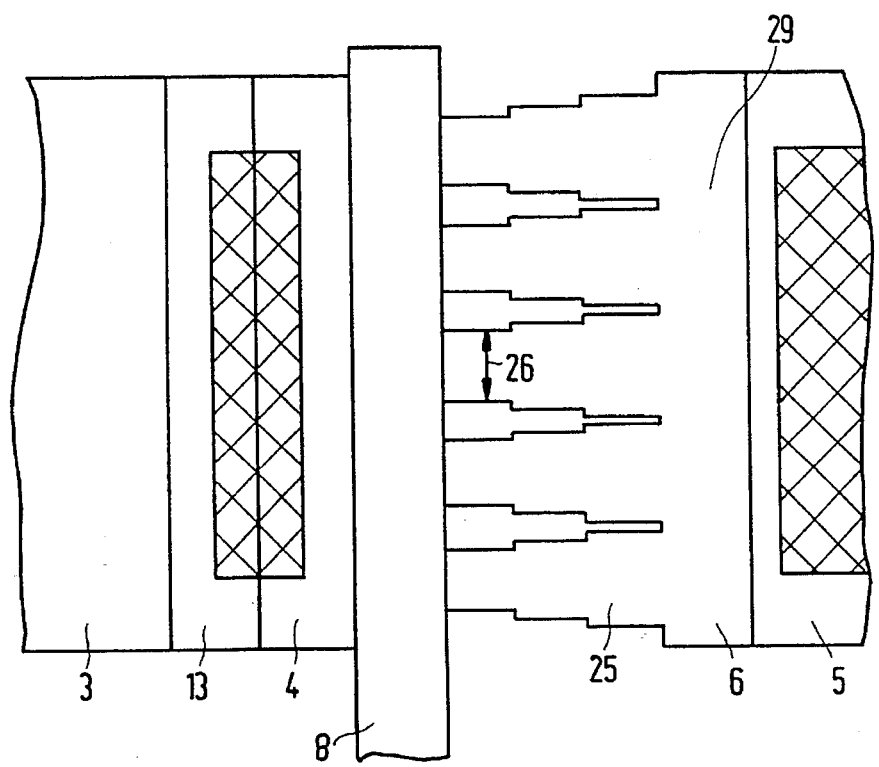

FIGS. 5 and 6 show how the width 26 of the zones 25 increases from the channel region 7 to the drain region 5 in a further embodiment. This embodiment offers the advantage that the drain breakdown voltage increases compared with zones 25 having a constant width 26. Owing to an increasing width 26 of the zones 25 from the channel region 7 to the drain region 5, the electric field is more evenly spread, so that the maximum value of the electric field is reduced and drain breakdown takes place at higher voltages. A further advantage is that the on-resistance of the transistor is reduced because the increasing width 26 of the zones 25 renders the resistance of the zones 25 lower compared with that of zones 25 having a constant width 26. The width 26 of the zones may increase continuously from the channel region 7 as shown in FIG. 5. Alternatively, the increase in width 26 may be stepped as in FIG. 6. This last embodiment is readily realized by means of photolithographic techniques. In the examples of FIGS. 5 and 6, the zone 25 has a width of 6 µm where it adjoins the channel region 7, while the zones 25 touch one another at a horizontal distance of 10 µm from the channel region. The total length of the drain extension region 6 is 18 µm. Compared with zones 25 having a constant width, the drain breakdown voltage then increases while the on-resistance decreases.

FIG. 1 shows an embodiment in which the zones 25 are interconnected by a region 31 of the second conductivity type in a portion of the drain extension region 6 which adjoins the channel region 7. The channel region 7 then is a continuous region, i.e. current can cross from the source region 4 to the drain extension region 6 over the entire width of the channel 7 and not only at the areas of the zones 25, which results in a steeper transistor. This means that the current change through the transistor at a gate voltage change is greater for a transistor provided with the region 31 than for a transistor without the region 31. To realize a high drain breakdown voltage, it may be desirable to use additional means for depleting the drain extension region 6 adjoining the channel region 7, especially the region 31, through the application of a field plate 16 above this portion of the drain extension region 6. The field plate 16 is separated from the drain extension region 6 by an insulating layer 17, in this example made of silicon oxide, and is electrically connected to the source. It is alternatively possible to deplete this portion of the drain extension region 6 by the application of a strongly doped layer 18 of the first conductivity type on a boundary between substrate 10 and surface region 3. This strongly doped layer 18 then extends to below the portion 31 of the drain extension region 6 which adjoins the channel region 7. The portion 31 of the drain extension region 6 which adjoins the channel region 7 is then additionally depleted from the strongly doped region 18, so that no premature breakdown occurs in this portion 31 of the drain extension region 6. A region 31 with a doping of $6 \times 10^{12}$ atoms/cm$^2$ is provided in the example of FIG. 1.

FIGS. 1, 5 and 6 show a further embodiment in which the zones 25 are interconnected by a region 29 of the second conductivity type in a portion of the drain extension region 6 which adjoins the drain region 5. The transition between the drain extension region 6 and the drain region 5 is less abrupt then, so that no peaks occur in electric fields and a higher drain breakdown voltage can be realized. This embodiment gives an extra high drain breakdown voltage when the region 29 is doped more strongly than the remainder of the drain extension region 6. Such a strong doping may be realized in a simple manner during the manufacture of the zones 25. The average concentration of doping atoms in the zones 25 is comparatively low owing to diffusion during the manufacture of the zones 25. Much lower losses of dopant atoms owing to diffusion take place in the continuous region 29, so that this region 29 will have a higher doping level than the zones 25. In the examples of FIGS. 1, 5 and 6, a region 29 with a width of 8 µm is provided. Such a region 29 increases the drain breakdown voltage and reduces the on-resistance of the transistor according to the invention as compared with a transistor without a region 29.

The invention is not limited to the embodiments described above. Thus, for example, a body of a semiconductor material other than silicon may be used. The surface region 3 may be provided not only by epitaxial growth but also by diffusion or implantation. It is also possible for the conductivity types of the regions in the examples to be the opposites.

I claim:

1. A semiconductor device with a semiconductor body comprising a surface region of a first conductivity type which adjoins a surface and in which a field effect transistor with an insulated gate is provided, with source and drain regions of the second, opposed conductivity type in the surface region and a drain extension region of the second conductivity type which adjoins the drain region and the surface, which has a lower doping concentration than the drain region, and which extends longitudinally in the direction of the source region, with a channel region of the first conductivity type situated between the drain extension region and the source region, and with a gate electrode situated above the channel region and separated from the channel region by an insulating layer, characterized in that the drain extension region comprises a plurality of zones of the second conductivity type, said zones extending from the channel region to the drain region and having means for fully depleting the drain extension region and comprising said zones having a width and doping concentration such that upon an increase in the voltage difference across the blocked pn junction between the surface region and the drain extension region the drain extension region is fully depleted at least locally before drain breakdown takes place, said zones being spaced apart at said channel region.

2. A semiconductor device as claimed in claim 1, characterized in that the width of the zones is approximately equal to the depth of the drain extension region, while the doping concentration decreases from the centre of each zone to an edge of the zone.

3. A semiconductor device as claimed in claim 1, characterized in that the width of the zones increases from the channel region to the drain region.

4. A semiconductor device as claimed in claim 1, characterized in that the zones are interconnected by a region of the second conductivity type in a portion of the drain extension region which adjoins the drain region.

5. A semiconductor device as claimed in claim 1, characterized in that the quantity of dopant atoms in the zones is approximately $6 \times 10^{12}$ atoms/cm$^2$.

* * * * *